US008472167B2

(12) United States Patent
Walance et al.

(10) Patent No.: US 8,472,167 B2
(45) Date of Patent: Jun. 25, 2013

(54) HIGH CURRENT CLAMPING CONNECTOR

(75) Inventors: Robert Walance, Newbury Park, CA (US); Lance Buterbaugh, Northridge, CA (US)

(73) Assignee: Ixia, Calabasas, CA (US)

( * ) Notice: Subject to any disclaimer, the term of this patent is extended or adjusted under 35 U.S.C. 154(b) by 368 days.

(21) Appl. No.: 12/898,209

(22) Filed: Oct. 5, 2010

(65) Prior Publication Data
US 2012/0081855 A1   Apr. 5, 2012

(51) Int. Cl.
*H02B 1/00* (2006.01)
*H02B 5/00* (2006.01)
*H05K 5/00* (2006.01)
*H05K 7/16* (2006.01)

(52) U.S. Cl.
USPC ........... 361/601; 361/602; 361/724; 361/725; 361/726; 361/727

(58) Field of Classification Search
USPC ................. 361/724, 725, 726, 727, 601, 602, 361/801
See application file for complete search history.

(56) References Cited

U.S. PATENT DOCUMENTS

| 4,601,531 | A | | 7/1986 | Wider |
|---|---|---|---|---|
| RE33,283 | E | * | 7/1990 | Hollingsead et al. ......... 439/296 |
| 4,977,484 | A | * | 12/1990 | Cunningham et al. ........ 361/832 |
| 5,383,090 | A | | 1/1995 | Freundner et al. |
| 6,544,052 | B1 | * | 4/2003 | Schwartz ....................... 439/152 |
| 7,248,483 | B2 | * | 7/2007 | West ............................ 361/801 |
| 7,365,964 | B2 | * | 4/2008 | Donahue, IV ................ 361/622 |
| 7,523,322 | B2 | * | 4/2009 | Emberty et al. .............. 713/300 |
| 8,018,735 | B2 | * | 9/2011 | Kunkle et al. ................ 361/801 |
| 2003/0224665 | A1 | * | 12/2003 | Neumann et al. ............. 439/638 |
| 2008/0007909 | A1 | * | 1/2008 | Merkin et al. ................ 361/685 |
| 2008/0030962 | A1 | * | 2/2008 | Kunkle et al. ................ 361/726 |

OTHER PUBLICATIONS

Stephan Schoft et al, Joint Resistance of Busbar-Joints with Randomly Rough Surfaces, Proceedings of the 21st Conference on Electrical Contacts 2002, Zurich, pp. 230-237.

* cited by examiner

*Primary Examiner* — Anthony Haughton
(74) *Attorney, Agent, or Firm* — SoCal IP Law Group LLP; John E. Gunther; Steven C. Sereboff

(57) ABSTRACT

There is disclosed an apparatus including a chassis configured to accept a plurality of blades. The chassis may contain a backplane assembly may include a backplane bus bar configured to provide electrical power to the plurality of blades and a power supply configured to deliver electrical power through a power delivery bus bar. A clamp may be disposed to force the power delivery bus bar into electrical contact with the backplane bus bar.

16 Claims, 7 Drawing Sheets

HIGH CURRENT CLAMPING CONNECTOR

NOTICE OF COPYRIGHTS AND TRADE DRESS

A portion of the disclosure of this patent document includes material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

1. Field

This disclosure relates to distributing electrical power within complex electronic systems.

2. Description of the Related Art

Complex electronic equipment, such as mainframe computers, server arrays, network routers and switches, and network test equipment, are typically configured as a chassis including a plurality of blades. Blades may also be referred to as cards, line cards, network cards, or modules. Each blade may include a plurality of integrated circuit devices including processors, field programmable gate arrays (FPGAs), application specific integrated circuits (ASICs), programmable logic devices (PLDs), programmable logic arrays (PLAs), memory circuits, and other kinds of devices. In addition, blades may include other analog and digital components, software, and/or firmware. A chassis may include, for example, twelve or sixteen blades. The power consumption of each blade may exceed 500 watts, such that the total power consumption within a chassis may exceed 6000 watts.

A chassis typically includes at least one power supply to convert primary electric power into secondary electrical power, and a power distribution system to distribute the secondary electrical power to the blades. To allow replacement of a power supply in the event of the failure, the power supply and the power distribution system may be configured to allow the power supply to be disconnected from the power distribution. For example, the electrical connection between the power supply and the power distribution system may be made via high current electrical connectors. However, the current flow between the power supply and the power distribution subsystem may be hundreds of Amperes. Electrical connectors suitable of conducting this current level are bulky, have high insertion force and cause a significant voltage drop, and thus may be unsuitable for use in some equipment.

Alternatively, the electrical connections between a power supply and a power distribution system may be made using bus bars or heavy electrical cables with bolted joints. However, bolting the joints between bus bars and/or cables that couple a power supply to a power distribution system requires both tools and easy access to the bolted connections. In the event of a power supply failure, it may be preferable that the failed power supply can be removed and a replacement power supply installed without the use of tools.

Throughout this description, elements are assigned three-digit reference designators, where the most significant digit indicates the figure number where the element is first introduced. An element that is not described in conjunction with a figure may be presumed to have the same characteristics and function as a previously-described element having the same reference designator.

DETAILED DESCRIPTION

Description of Apparatus

Figure 1:
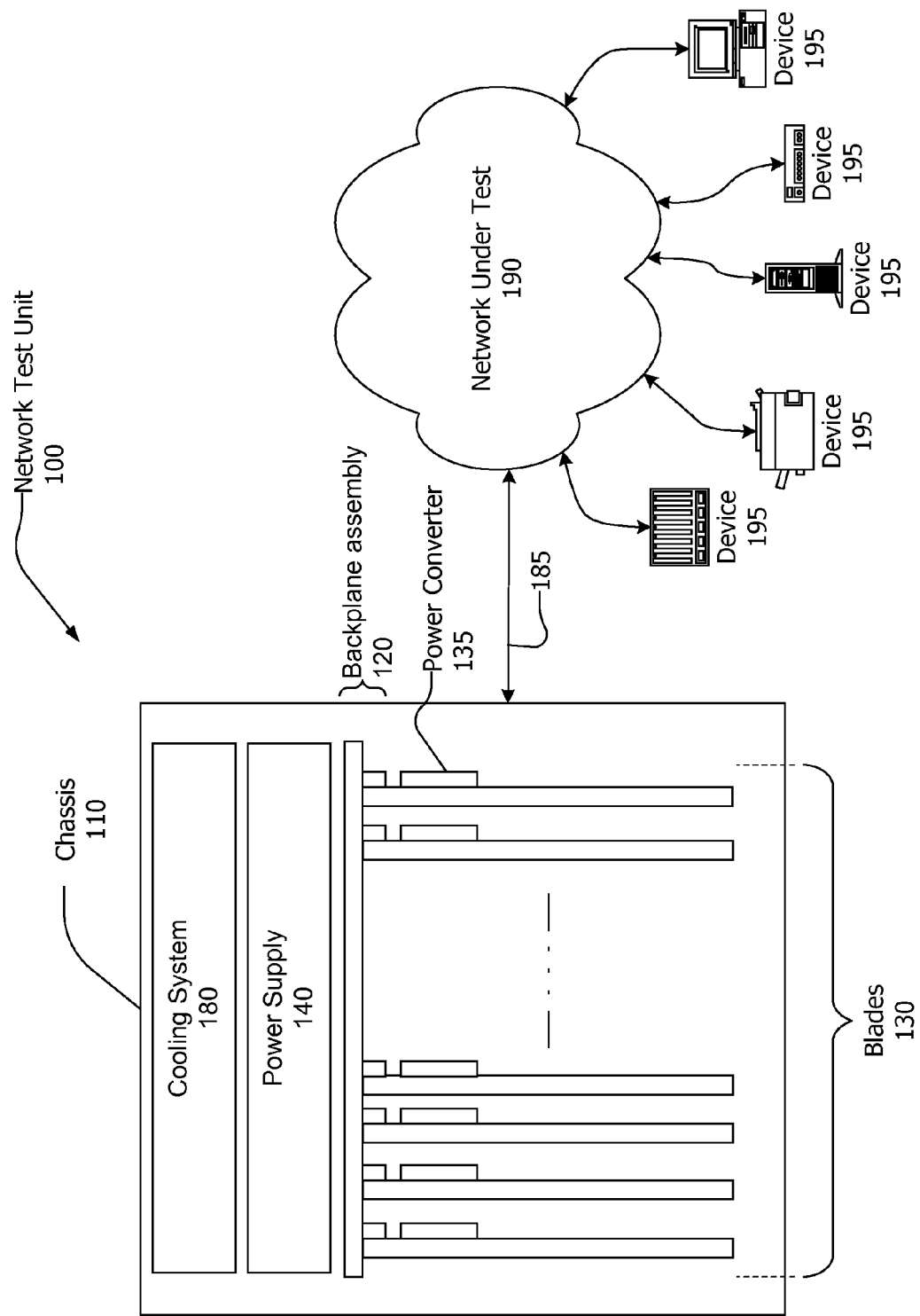
FIG. 1 is a block diagram of a network test unit connected to a network.

FIG. 1 shows a block diagram of a network test unit 100 connected to a network under test 190 via a communications path 185. The network under test 190 may include, or be coupled to, a plurality of other devices 195 capable of communicating via the network. The network test unit 100 may be a network testing device, performance analyzer, conformance validation system, network analyzer, or network management system. The network test unit 100 may include one or more blades 130, which may also be called network cards or modules, and a backplane assembly 120 included or enclosed within a chassis 110. The chassis 110 may also include a power supply 140 and a cooling system 180 to remove heat generated by components on the blades 130. The chassis 110 may be a fixed or portable chassis, cabinet, or enclosure suitable to include the components of the network test unit 100.

The network test unit 100 shown in FIG. 1 is exemplary of complex electronic equipment. Other electronic equipment that may be configured as a plurality of replaceable blades or cards within a chassis include mainframe computers, server computers, mass storage systems, communications network equipment such as routers and switches, and other complex electronic equipment.

Each of the blades 130 may be independently removable and replaceable in the chassis 110. Each of the blades 130 may interconnect with the backplane assembly 120 via respective connectors (not identified). The backplane assembly 120 may serve as a bus or communications medium to route data and signals between the blades 130. The backplane assembly 120 may also route secondary electrical power from the power supply 140 to the blades 130 via the connectors that couple each blade to the backplane.

Each blade 130 may include processors, memories, and/or other integrated circuit devices and other components (not shown) as required to perform the blade's intended function. Each blade 130 may also include a power converter 135. Each power converter 135 may receive secondary electrical power from the power supply 140 via the backplane assembly 120. Each power converter may convert the secondary electrical power into one or more low-voltage sources to power the blades' integrated circuit devices.

Figure 2:
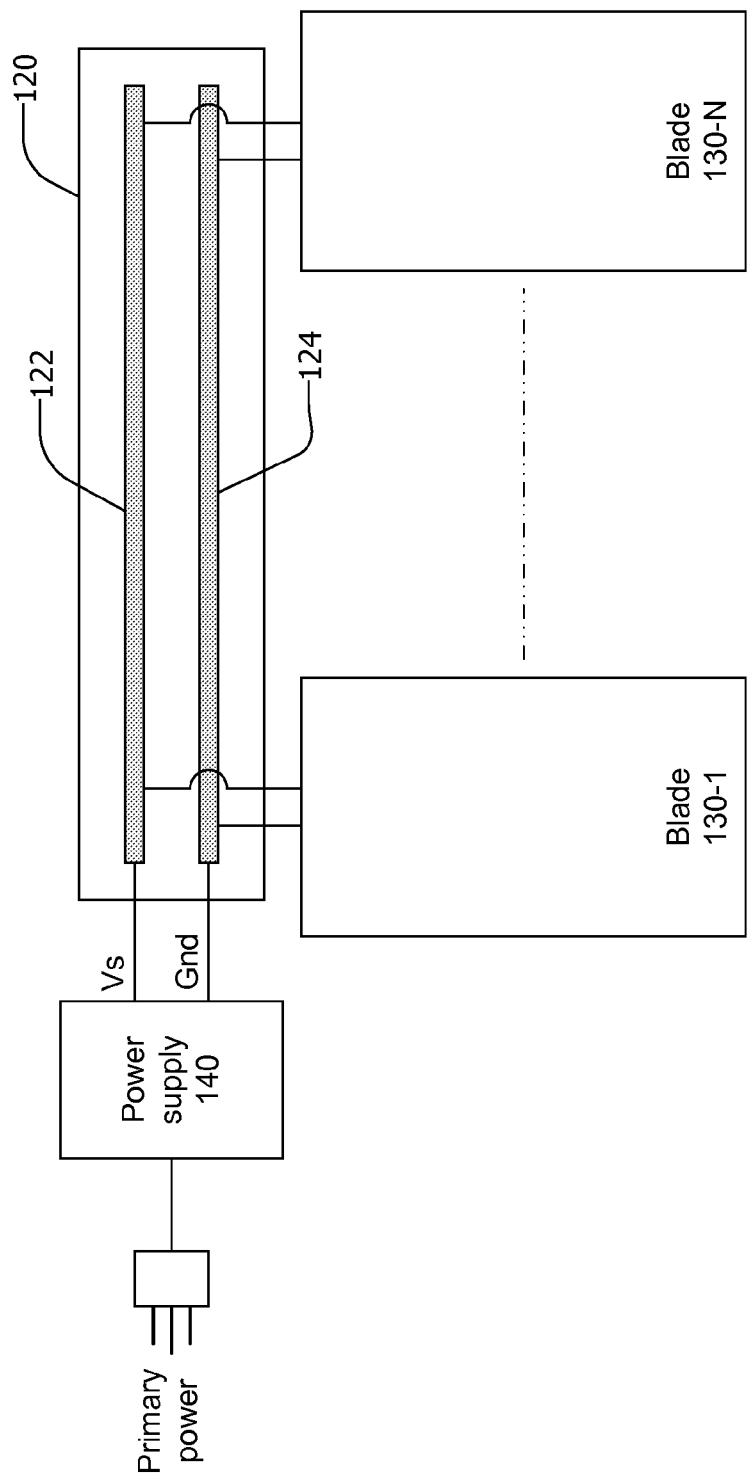
FIG. 2 is a simplified schematic diagram showing electrical power distribution within a chassis.

FIG. 2 is a simplified schematic diagram of a power distribution subsystem within a chassis such as the chassis 110. In the example of FIG. 2, the chassis includes N blades, 130-1 to 130-N, where N is an integer greater than one. N may be, for example, 10 or 12 or 16 or some other number of blades. A power supply 140 within the chassis may receive primary electrical power from a building or other facility where the chassis is located. The primary power may be, in the United States, conventional 115-volt 60-Hertz single-phase AC power. In the case of a large chassis or a multi-chassis system, the primary power may be 230-volts single-phase AC power, or may be 208-volt or 415-volt three-phase AC power. The power supply 140 may output secondary electrical power in the form of a single DC voltage Vs. The voltage level of the secondary electrical power may be, for example, 12 volts, 30 volts, 48 volts, or some other voltage.

The secondary voltage Vs and the ground return Gnd from the power supply 140 may be coupled to the plurality of blades 130-1 to 130-N via a backplane assembly 120. To ensure that the same secondary voltage is supplied to each of the blades, the backplane assembly must deliver hundreds of amps of current to the blades with little voltage drop. The backplane assembly 120 may include a first backplane bus bar 122 and a second backplane bus bar 124 to conduct the Vs and Gnd currents, respectively. The backplane bus bars 122, 124 may be fabricated from materials, such as copper or aluminum, having high electrical conductivity. The backplane bus bars 122, 124 may have a large cross-sectional area to provide very low electrical resistance and thus very low voltage drop across the backplane.

Figure 3:
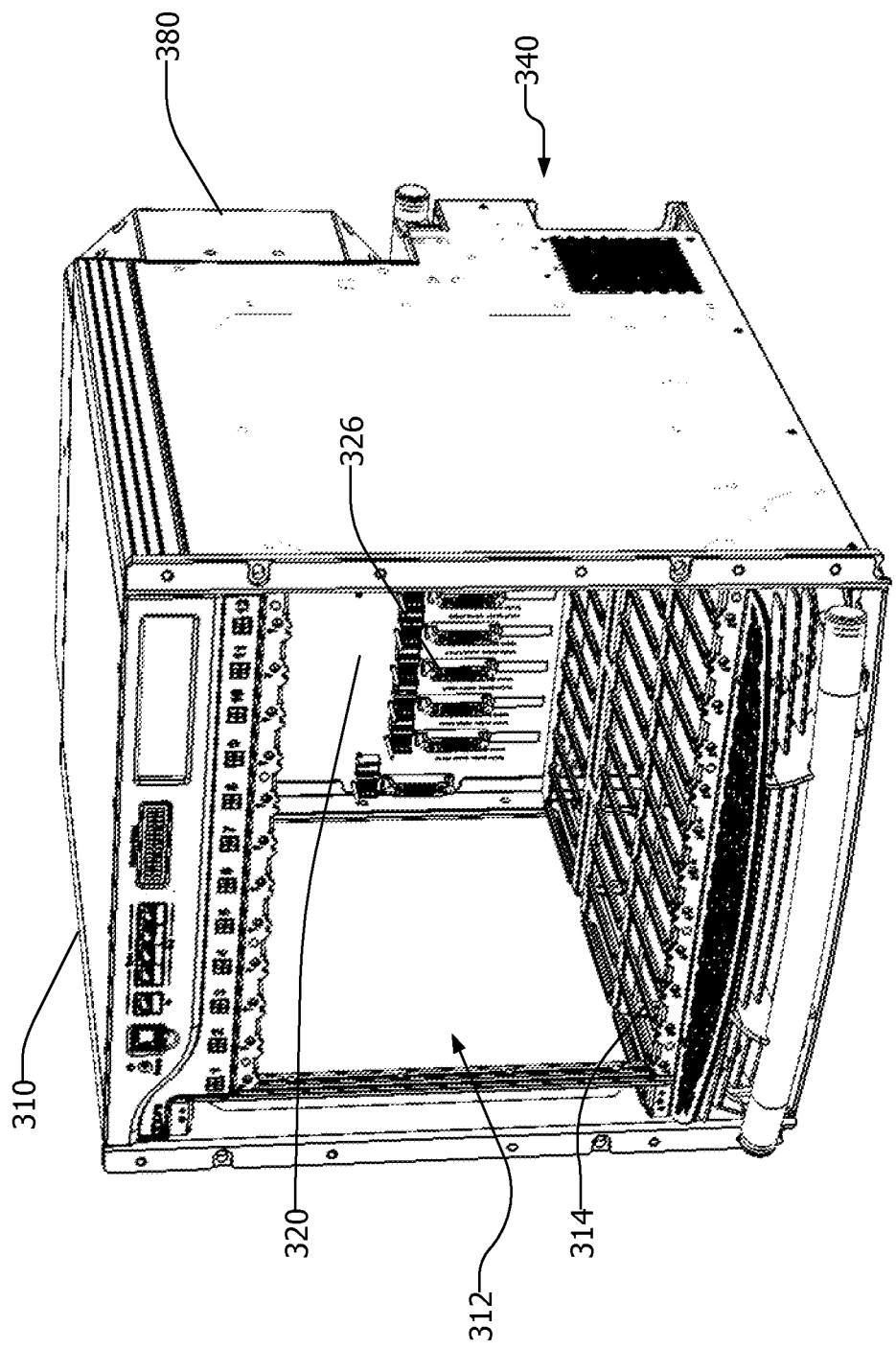
FIG. 3 is a perspective view of an exemplary chassis.

Referring now to FIG. 3, a chassis 310 may include a central cavity 312 configured to accept a plurality of blades (not shown). The chassis 310 may include card guides 314 to facilitate sliding blades into position within the cavity. A backplane assembly 320 positioned at the end of the cavity 312 may include connectors 326 to couple to each blade.

A cooling system 380 may be disposed at the rear of the chassis 310 behind the backplane assembly 320. The cooling system 380 may include, for example, fans that force air to circulate over the blades to remove heat. A power supply 340 may also be disposed at the rear of the chassis 310 behind the backplane assembly 320. A cooling system and power supply may be disposed at other positions within a chassis.

Figure 4:
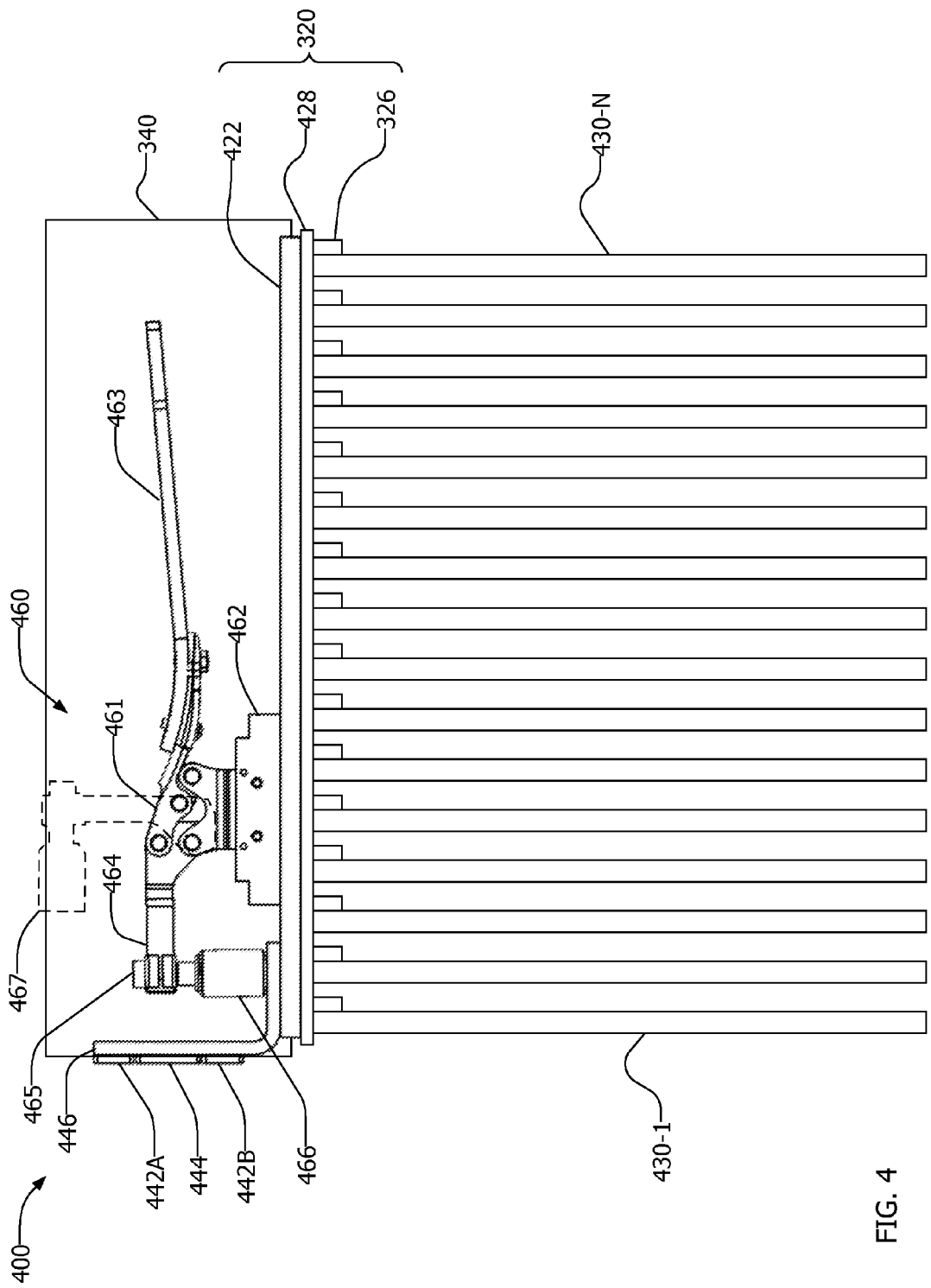
FIG. 4 is a schematic top view of a power distribution system.

FIG. 4 shows a schematic top view of a power distribution system 400 for use within the chassis 310. To allow visibility of the power distribution system, a cooling system and structural components of the chassis 310 are not shown in FIGS. 4-7.

In FIG. 4, a plurality of blades 430-1 to 430-N are coupled to the backplane assembly 320 by respective connectors 326. The backplane assembly 320 may include a mother board 428 to route data and signals between the connectors 326. The backplane assembly 320 may include one or more backplane bus bars, of which a first backplane bus bar 422 is visible in FIG. 4. The backplane bus bars may be electrically connected to outputs of the power supply 340 by two or more power supply bus bars 442A, 442B, and 444 and two or more angle bus bars, of which a first angle bus bar 446 is visible in FIG. 4. The power supply bus bars 442A, 442B, and 444 may connect to respective output terminals (not shown) of the power supply 340. In the example of FIG. 4, the power supply bus bars 442A and 442B may connect to separate positive output terminals of the power supply 340, and the power supply bus bar 444 may connect to a negative or ground output terminal of the power supply 340. The power supply bus bars 442A, 442B, and 444 may connect to the two or more angle bus bars (including the first angle bus bar 446), and the angle bus bars may connect to respective backplane bus bars (including the first backplane bus bar 422).

In the power distribution system of FIG. 4, the power supply bus bars 442A, 442B, and 444 may be bolted to output lugs (not visible) of the power supply 340. The power supply bus bars 442A, 442B, and 444 may also be bolted, soldered, welded, or otherwise permanently connected to two or more angle bus bars, including the first angle bus bar 446. Since the power supply bus bars 442A, 442B, and 444 and the angle bus bars may be permanently or semi-permanently attached to the power supply, the power supply bus bars and the angle bus bars may be considered as portions of the power supply. The two or more angle bus bars may be connected to respective backplane bus bars using one or more clamps that urge the angled bus bars against the respective backplane bus bars with sufficient force to ensure a low resistance electrical connection. A discussion of the force required to establish a low resistance connection may be found in Stephan Schoft et al., "Joint Resistance of Busbar-Joints with Randomly Rough Surfaces", Proceedings of the 21$^{st}$ Conference on Electrical Contacts, 2002, Zurich, pp. 230-237.

In the power distribution system of FIG. 4, a first clamp 460 may force the first angle bus bar 446 against the first backplane bus bar 422. The clamp 460 may include a first toggle clamp 461, which may be a commercially available toggle clamp such as clamps available from De-Sta-Co, Carr Lane, and other suppliers. Toggle clamps are commonly used by machinists to hold a work piece against the table of a machine tool such as drill press or a milling machine. The first toggle clamp 461 may be mechanically connected to the first backplane bus bar 422 by a first base 462. The first base 462 may be made, at least in part, of a nonconductive or dielectric material to electrically isolate the first clamp 460 from the first bus bar 422. For example, the first base 462 may be made of a reinforced plastic material.

The first clamp 460 may include a first handle 463 and a first clamp bar 464. The first handle 463 may be coupled to the first clamp bar 464 by a series of pivots and links. When the first handle 463 in rotated to an open position (away from the first backplane bus bar 422), the links may act to cause the first clamp bar 464 to also rotate upward, as shown by the dashed shape 467. When the first handle is moved to a closed position, as shown in FIG. 4, the links may cause the first clamp bar to rotate downward (towards the first backplane bus bar 422, as shown). The links coupling the first handle 463 and the first clamp bar 464 may be configured such that the clamp is self-latching when the first handle is in the closed position as shown.

A first spindle 465 may be coupled to the first clamp bar 464 to force the first angle bus bar 446 against the first backplane bus bar 422. The first spindle 465 may, for example, include a threaded portion screwed into a mating threaded hole in the first clamp bar 464. Alternatively, one or more captive nuts may be used to couple a thread portion of the first spindle 465 to the first clamp bar 464. In either case, an effective length of the first spindle may be adjusted by rotating the spindle. When a rigid spindle, such as a simple bolt, is used to transfer force from a toggle clamp to an item being clamped, the clamping force may vary substantially with small variations in the thickness of item being clamped. The first spindle 465 may be compressible or may include a compressible portion. A compressible spindle may accommodate slight variations in the thickness of the first angle bus bar 446 and the first backplane bus bar 422 while maintaining sufficient force to ensure a low resistance electrical connection. The compressible spindle portion may be a resilient material or a spring mechanism. For example, as shown in FIG. 4, the first spindle 465 may include a spring plunger 466. The spring plunger 466 may be basically two telescoping cylinders enclosing a coil spring. The spring plunger 466 may be compressed when the first angle bus bar is clamped against the first backplane bus bar 422, such that a sufficient force is applied to the clamped joint independent of manufacturing tolerances on the bus bars. The spring plunger 466 and the spindle 465 may be, for example, a Plunger-Matic assembly available from De-Sta-Co.

When the first clamp bar 464 is rotated to the open position, as shown by the dashed outline 467, the power supply 140, including the attached power supply and angle bus bars, may be removed through the rear of the chassis (in the upward direction as shown in FIG. 4) without the use of tools to disconnect the electrical connection between the power supply and the first backplane bus bar 422.

Figure 5:
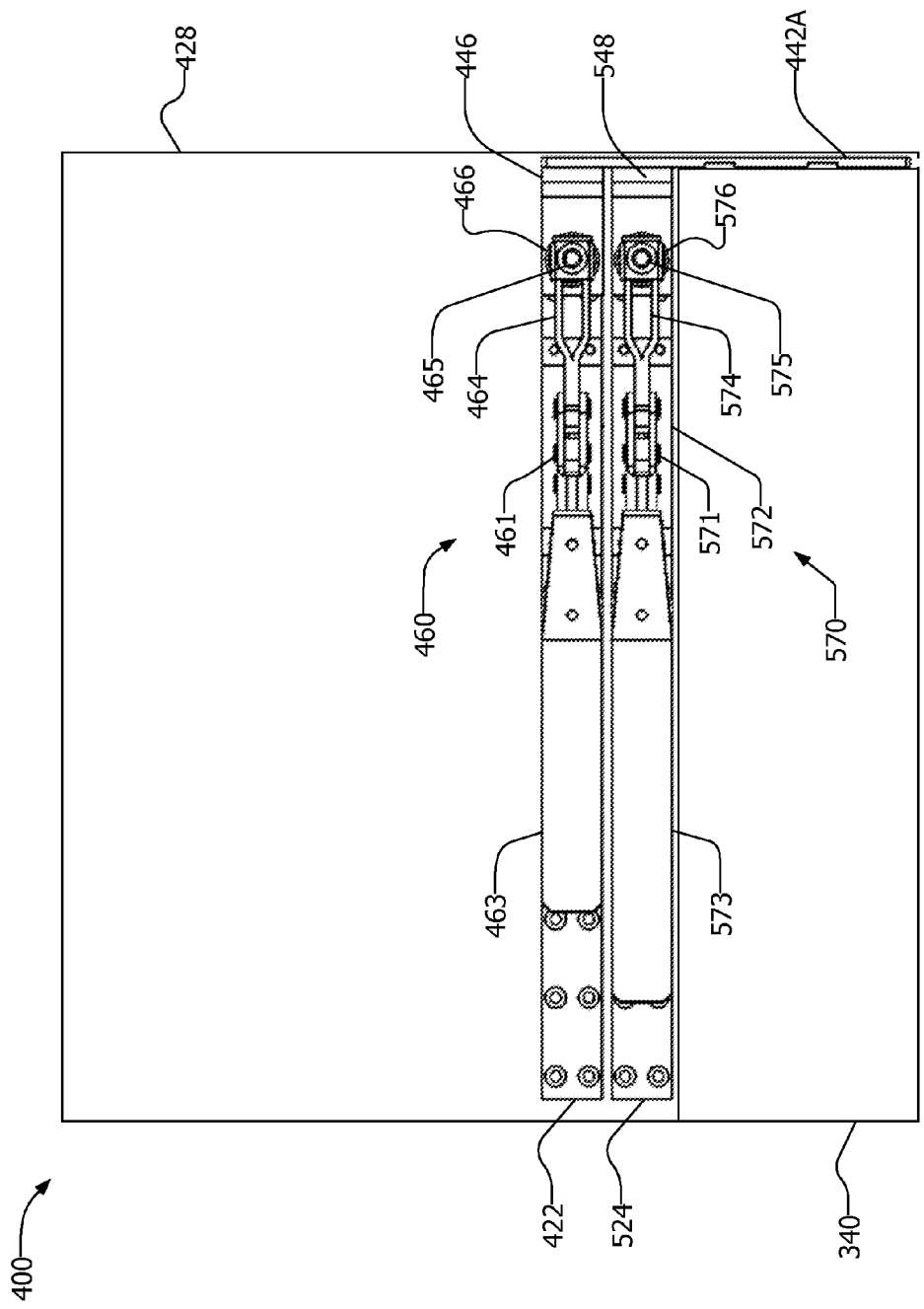
FIG. 5 is a schematic rear view of a power distribution system.

FIG. 5 shows a schematic back view of the exemplary power distribution system 400. Previously described elements visible in FIG. 5 include the power supply 340 and the motherboard 428 coupled to the first backplane bus 422. The power supply bus 442A may be connected to the first angle bus 446, which is clamped against the first backplane bus 422 by the first clamp 460, which includes the first toggle clamp 461, the first handle 463, the first clamp bar 464, the first spindle 465, and the first spring plunger 466.

A second backplane bus bar 524 may also be coupled to the motherboard 428. A second clamp 570 may clamp a second angle bus 548 against the second backplane bus bar 524. The configuration of the second clamp 570 may be substantially identical to the first clamp 460. The second clamp 570 may include a second toggle clamp 571, a second handle 573, a second clamp bar 574, a second spindle 575, and a second spring plunger 576. The second toggle clamp 571 may be mechanically attached to the second backplane bus bar 524 by a second base 572. The second base 572 may be fabricated from a nonconductive material to electrically isolate the second clamp 570 from the second backplane bus bar 524.

Figure 6:
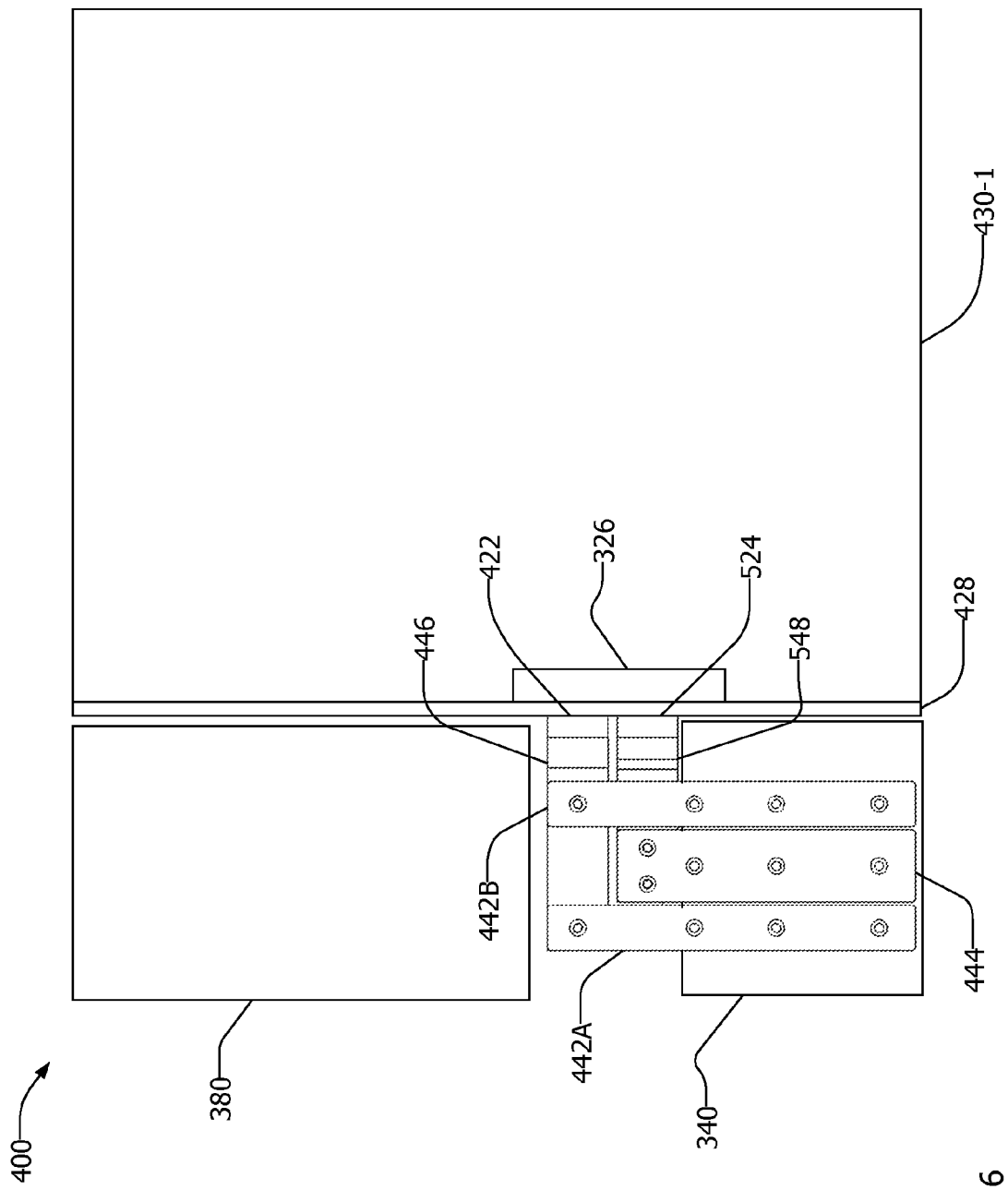
FIG. 6 is a schematic side view of a power distribution system.

FIG. 6 shows a schematic side view of the exemplary power distribution system 400. Previously described elements visible in FIG. 6 include the first blade 430-1 coupled to the motherboard 428 via the connector 426. The ends of the first backplane bus 422 and the second backplane bus 524 are visible. The first angle bus 446 and the second angle bus 548 may be clamped to the first backplane bus 422 and the second backplane bus 524, respectively, by first and second clamps (not visible). Power supply bus bars 442A, 442B and 444 may conduct secondary electrical power from the power supply 340 to the first and second angle bus bars 446, 548. The cooling system 380 may circulate cooling air to remove heat generated on a plurality of blades, of which on the first blade 430-1 is visible.

Figure 7:
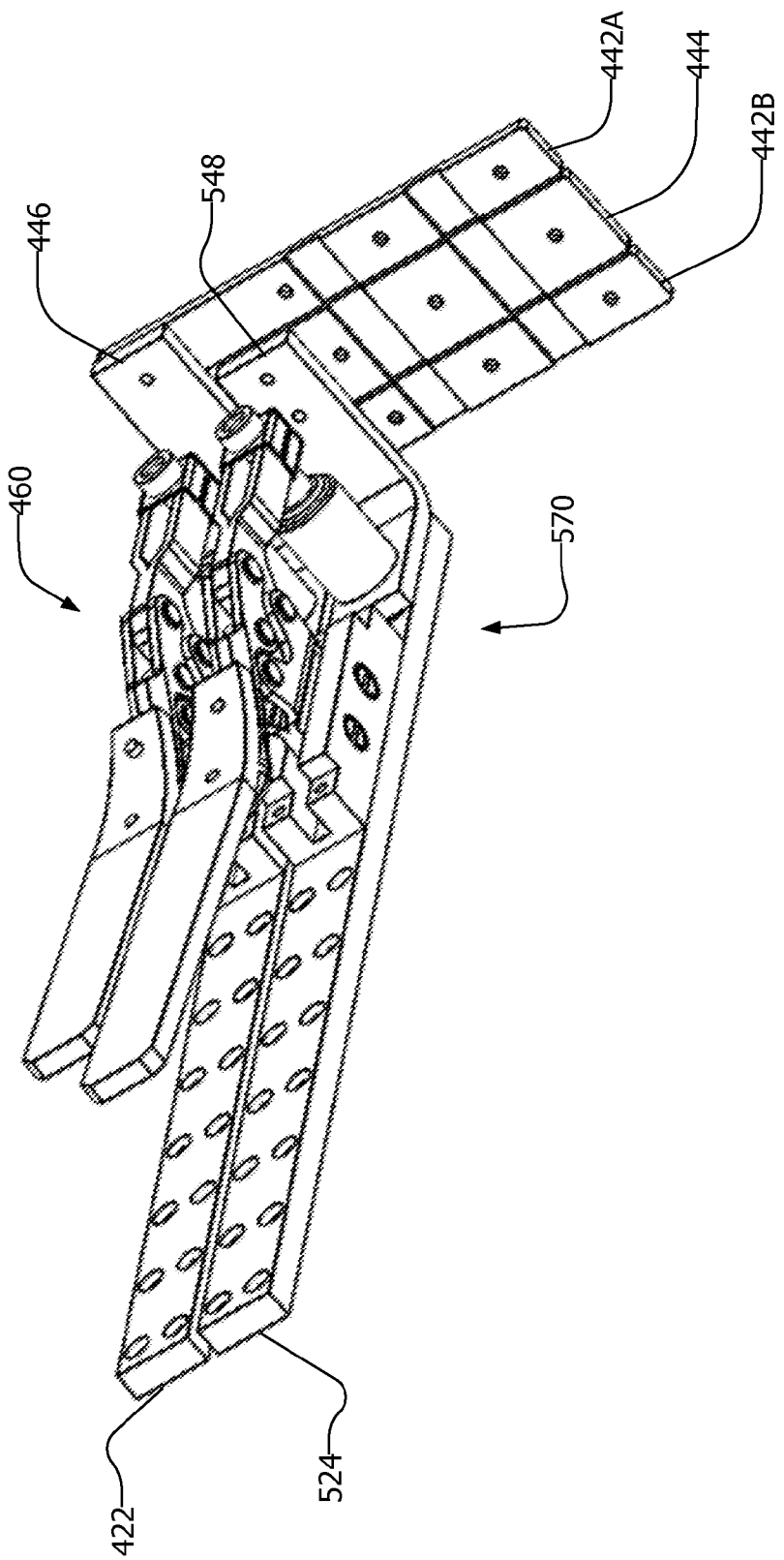
FIG. 7 is a perspective view of high current clamping connectors and associated bus bars.

FIG. 7 is a perspective view showing only the bus bars and clamps of the power distribution system 400. Previously described elements visible in FIG. 7 include the first angle bus bar 446 clamped to the first backplane bus bar 422 by the first clamp 460, the second angle bus bar 548 clamped to the second backplane bus bar 524 by he second clamp 570, and power supply bus bars 442A, 442B, and 444. Power supply bus bars 442A and 442B may be connected to the first angle bus bar 446 using bolts (not show), welding, soldering, or another connection method. Power supply bus bar 444 may be connected to the second angle bus bar 548 using bolts (not show), welding, soldering, or another connection method. A suitable insulator (not visible) may be disposed between the power supply bus bar 442B and the second angle bus bar 548 to prevent electrical contact.

In the exemplary power distribution system 400 of FIGS. 4-7, each backplane bus bar 422, 524 may have a thickness of 0.375 inch, a width of 1.0 inch, and a length of about 15 inches. Each angle bus bar 446, 548 may have a thickness of 0.25 inch and a width of 1.0 inch. The overlap area where each angled bus bar is clamped against the respective backplane bus bar may be about 1.0×1.625 inches. The first and second clamps 460, 570 may each be a De-Sta-Co part number 225-UB, and the first and second spindle and spring plunger assemblies 465/466, 575/576 may each be a De-Sta-Co part number 905. The force applied to clamp each angled bus bar against the respective backplane bus bar may be 50-100 pounds. The exemplary power distribution system 400 may be suitable to conduct 625 amps from the power supply to the backplane bus bars with a total voltage drop for all connections less than 0.20 volts.

Since the function of the power supply bus bars 442A, 442B, 444 and the angle bus bars 446, 548 is to deliver power from the power supply 340 to the backplane assembly 320, they may be collectively considered as power delivery bus bars. The power supply bus bars 442A, 442B and the first angle bus bar 446 constitute a first power delivery bus bar, and the power supply bus bar 444 and the second angle bus bar 548 constitute a second power delivery bus bar. A power delivery bus bar may be made from a single piece or two or more pieces joined by bolts, soldering, welding or other technique. Portions of a power delivery bus bar may be bent, folded, twisted, or flexible as necessary to convey power from a power supply to backplane assembly in a particular chassis.

A power distribution system may include more than two backplane bus bars, and may include more than two power delivery bus bars. A power distribution system may typically include at least one power delivery bus bar connected to each back plane bus bar. A power distribution system may include more or fewer than two clamps. A power distribution system may include one clamp for each backplane bus bar. A power distribution system may include fewer clamps than backplane bus bars, in which case at least some of the clamps may clamp multiple connections.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "carrying", "having", "including", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An apparatus, comprising:
   a chassis configured to accept a plurality of blades;
   a backplane assembly including a first backplane bus bar configured to provide electrical power to the plurality of blades;
   a power supply configured to deliver electrical power through a first power delivery bus bar; and
   a first clamp mounted on the first backplane bus bar, the first clamp including a clamp bar manually movable between an open position and a closed position without the use of tools, the clamp bar configured to force the first power delivery bus bar into electrical contact with the first backplane bus bar when the clamp bar is moved to the closed position.

2. The apparatus of claim 1, wherein
   the chassis and the power supply are configured such that, when the clamp bar is in the open position, the power supply may be removed from the chassis without the use of tools.

3. The apparatus of claim 1, wherein force is transferred from the clamp bar to the first power delivery bus bar through a compressible spindle coupled to the clamp bar.

4. The apparatus of claim 3, wherein the compressible spindle comprises a spring mechanism.

5. The apparatus of claim 3, wherein the compressible spindle is configured to provide at least a predetermined level of clamping force independent of variations in a thickness of the first power delivery bus bar and/or a thickness of the first backplane bus bar due to manufacturing tolerances.

6. The apparatus of claim 1, wherein the first clamp comprises a toggle clamp.

7. The apparatus of claim 6, wherein the first clamp further comprises a base that attaches the toggle clamp to the first backplane bus bar.

8. The apparatus of claim 7, wherein the base is, at least in part, nonconductive to provide electrical isolation between the toggle clamp and the first backplane bus bar.

9. The apparatus of claim 1, further comprising:
   a second clamp mounted on a second backplane bus bar, the second clamp disposed to force a second power delivery bus bar into electrical contact with the second backplane bus bar.

10. An apparatus, comprising:
    a chassis configured to accept a plurality of blades;
    a backplane assembly including a plurality of backplane bus bars configured to provide electrical power to the plurality of blades;
    a power supply configured to deliver electrical power through a plurality of power delivery bus bars; and
    one or more clamps, each clamp mounted on a respective one of the plurality of backplane bus bars, each clamp including a respective clamp bar manually movable between an open position and a closed position without the use of tools, each clamp bar configured to force a respective one of the plurality of power delivery bus bars into electrical contact with the backplane bus bar on which the clamp is mounted when the clamp bar is moved to the closed position.

11. The apparatus of claim 10, wherein
    the chassis and the power supply are configured such that, when the respective clamp bars of the one or more clamps are all moved to the open position, the power supply may be removed from the chassis without the use of tools.

12. The apparatus of claim 10, wherein
    the plurality of backplane bus bars comprises a first backplane bus bar and a second backplane bus bar, and
    the plurality of power delivery bus bars comprises a first power delivery bus bar and a second power delivery bus bar.

13. The apparatus of claim 12, wherein the one or more clamps comprises:
    a first clamp configured to force the first power delivery bus bar into electrical contact with the first backplane bus bar, and
    a second clamp configured to force the second power delivery bus bar into electrical contact with the second backplane bus bar.

14. A method of delivering electrical power from a power supply to a plurality of blades coupled to a backplane assembly within a chassis, comprising:
    forcing a power delivery bus bar of the power supply into electrical contact with a backplane bus bar using a clamp mounted on the backplane bus bar, the clamp including a clamp bar manually movable between an open position and a closed position without the use of tools, the clamp bar configured to force the power delivery bus bar into electrical contact with the backplane bus bar when the clamp bar is moved to the closed position;
    conveying the electrical power to the backplane bus bar through the power delivery bus bar; and
    distributing the electrical power to the blades through the backplane bus bar.

15. The method of claim 14, the method further comprising:
    manually moving the clamp to the closed position to force the power delivery bus bar into electrical contact with the backplane bus bar.

16. The method of claim 15, further comprising:
    in a case where the power supply must be removed from the chassis, manually moving the clamp to the open position; and
    removing the power supply including the power delivery bus bar from the chassis without the use of tools.

* * * * *